(12) United States Patent
Sreenivasan et al.

(10) Patent No.: US 8,187,515 B2
(45) Date of Patent: May 29, 2012

(54) LARGE AREA ROLL-TO-ROLL IMPRINT LITHOGRAPHY

(75) Inventors: Sidlgata V. Sreenivasan, Austin, TX (US); Shrawan Singhal, Austin, TX (US); Byung Jin Choi, Austin, TX (US); Ian Matthew McMackin, Austin, TX (US)

(73) Assignees: Molecular Imprints, Inc., Austin, TX (US); Board of Regents, The University of Texas, Austin, TX (US)

( * ) Notice: Subject to any disclaimer, the term of this patent is extended or adjusted under 35 U.S.C. 154(b) by 194 days.

(21) Appl. No.: 12/415,563

(22) Filed: Mar. 31, 2009

(65) Prior Publication Data

US 2009/0243153 A1    Oct. 1, 2009

Related U.S. Application Data

(60) Provisional application No. 61/041,264, filed on Apr. 1, 2008.

(51) Int. Cl.
*B28B 11/08* (2006.01)

(52) U.S. Cl. ........ 264/293; 264/319; 425/363; 425/371; 425/385

(58) Field of Classification Search ................. 264/293, 264/319; 425/387.1, 389, 363, 364 R, 371
See application file for complete search history.

(56) References Cited

U.S. PATENT DOCUMENTS

| | | | |
|---|---|---|---|
| 5,480,596 A * | 1/1996 | Okubo et al. ................. 264/1.33 |
| 6,334,960 B1 | 1/2002 | Willson et al. |
| 6,696,220 B2 | 2/2004 | Bailey et al. |
| 6,842,229 B2 | 1/2005 | Sreenivasan et al. |
| 6,871,558 B2 | 3/2005 | Choi et al. |
| 6,908,861 B2 | 6/2005 | Sreenivasan et al. |
| 6,916,585 B2 | 7/2005 | Sreenivasan et al. |
| 6,926,929 B2 | 8/2005 | Watts et al. |
| 6,929,762 B2 | 8/2005 | Rubin |
| 6,932,934 B2 | 8/2005 | Choi et al. |
| 6,990,870 B2 | 1/2006 | Choi et al. |
| 7,060,324 B2 | 6/2006 | Bailey et al. |
| 7,071,088 B2 | 7/2006 | Watts et al. |
| 7,090,716 B2 | 8/2006 | McMackin et al. |
| 7,252,715 B2 | 8/2007 | Watts et al. |
| 7,270,533 B2 | 9/2007 | McMackin et al. |
| 7,303,383 B1 | 12/2007 | Sreenivasan et al. |
| 7,338,275 B2 | 3/2008 | Choi et al. |
| 7,365,103 B2 | 4/2008 | Willson et al. |
| 7,444,932 B2 * | 11/2008 | Strand et al. ................. 101/23 |
| 7,531,025 B2 | 5/2009 | McMackin et al. |
| 7,641,840 B2 * | 1/2010 | Choi et al. ................... 264/299 |
| 2004/0141163 A1 | 7/2004 | Bailey et al. |
| 2004/0163563 A1 | 8/2004 | Sreenivasan et al. |
| 2005/0061773 A1 | 3/2005 | Choi et al. |
| 2005/0160934 A1 | 7/2005 | Xu et al. |
| 2005/0187339 A1 | 8/2005 | Xu et al. |
| 2005/0189676 A1 | 9/2005 | Sreenivasan |

(Continued)

*Primary Examiner* — Maria Veronica Ewald
*Assistant Examiner* — Robert J Grun
(74) *Attorney, Agent, or Firm* — Cameron A. King (57) ABSTRACT

Droplets of polymerizable material may be patterned on a film sheet. The droplets of polymerizable material may be dispensed on the film sheet. A pre-determined force may be applied to an imprint lithography template such that localized trapping of the droplets of the polymerizable material on the film sheet is minimized and the droplets coalesce to form a continuous layer. The polymerizable material may be solidified to form a patterned layer having a residual layer and at least one feature.

14 Claims, 8 Drawing Sheets

U.S. PATENT DOCUMENTS

| | | |
|---|---|---|
| 2005/0236739 A1 | 10/2005 | Willson et al. |
| 2005/0270312 A1 | 12/2005 | Lad et al. |
| 2006/0062922 A1* | 3/2006 | Xu et al. .................... 427/372.2 |
| 2006/0076717 A1 | 4/2006 | Sreenivasan et al. |
| 2006/0077374 A1 | 4/2006 | Sreenivasan et al. |
| 2006/0115999 A1 | 6/2006 | Sreenivasan et al. |
| 2007/0141271 A1 | 6/2007 | Xu et al. |
| 2007/0228589 A1* | 10/2007 | Choi et al. ...................... 264/39 |
| 2008/0141862 A1 | 6/2008 | Xu et al. |
| 2008/0153312 A1 | 6/2008 | Sreenivasan et al. |
| 2008/0174046 A1 | 7/2008 | Choi et al. |
| 2008/0199816 A1 | 8/2008 | Choi et al. |

* cited by examiner

LARGE AREA ROLL-TO-ROLL IMPRINT LITHOGRAPHY

CROSS-REFERENCE TO RELATED APPLICATIONS

This application claims the benefit under 35 U.S.C. §119 (e)(1) of U.S. Provisional No. 61/041,264, filed on Apr. 1, 2008, which is hereby incorporated by reference herein in its entirety.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference herein.

An imprint lithography technique disclosed in each of the aforementioned U.S. patent publications and patent includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope.

DETAILED DESCRIPTION

Figure 1:
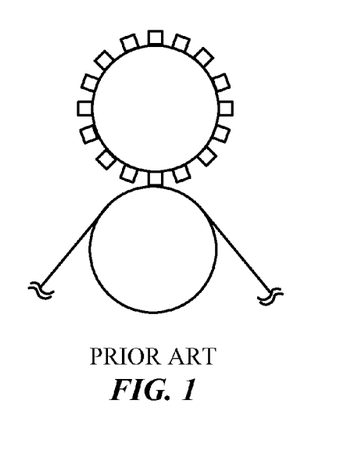
FIG. 1 illustrates a simplified side view of a prior art lithography system.

Referring to the figures, and particularly to FIG. 1, prior art roller assembly systems used in lithography, such as the one shown, employ a template that is difficult to fabricate while retaining fidelity of the pattern intended. For example, when using such a design for the system, the fidelity of the pattern is compromised for templates having features less than sub-100 nm. Additionally, uniform pressure is difficult to achieve, and as such, the features of the pattern formed from such a roller assembly system may be distorted due to the resulting uneven pressure.

Figure 2:
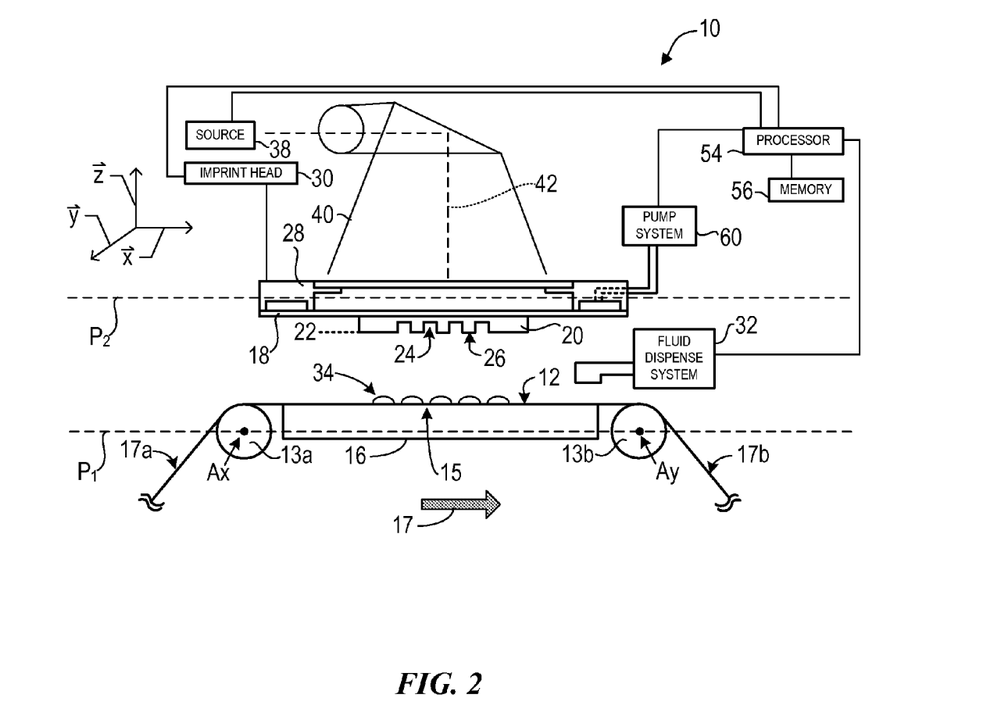
FIG. 2 illustrates a simplified side view of a lithography system in accordance with an embodiment of the present invention.
Figure 3:
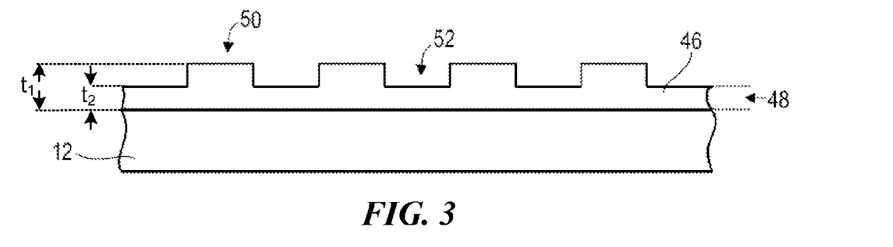
FIG. 3 illustrates a simplified side view of the film sheet shown in FIG. 2 having a patterned layer positioned thereon.
Figure 4:
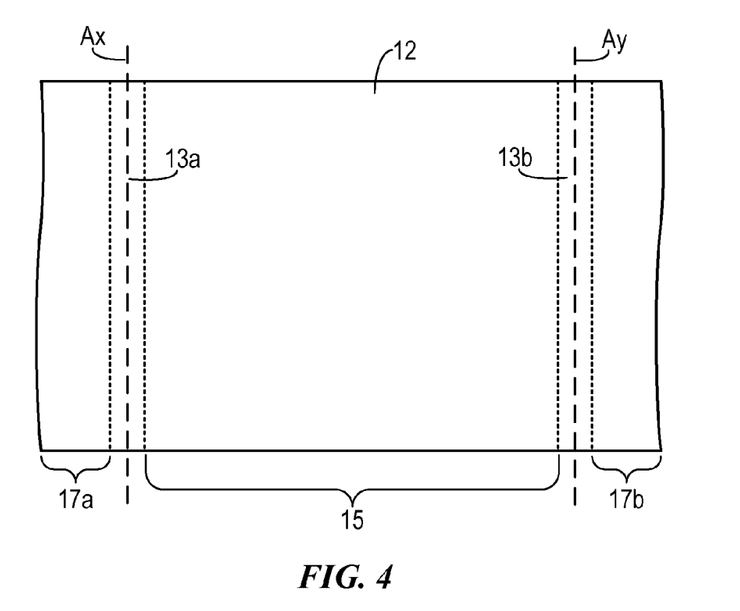
FIG. 4 illustrates a top down view of the roller assembly shown in FIG. 2.

Referring to FIGS. 2-4, illustrated therein is a lithographic system 10 used to form a relief pattern on a film sheet 12 in accordance with the present invention. The material of the film sheet 12 may include, but is not limited to, polymeric film, glass, silicon, silicon nitride, Kevlar™ reinforced polymer films, aluminum, and/or similar materials. Thickness of film sheet 12 may be based on design considerations. For example, film sheet 12 may be a thin film sheet 12 with a thickness of approximately 10 μm-500 μm. Film sheet 12 may be highly flexible.

Figure 7A:
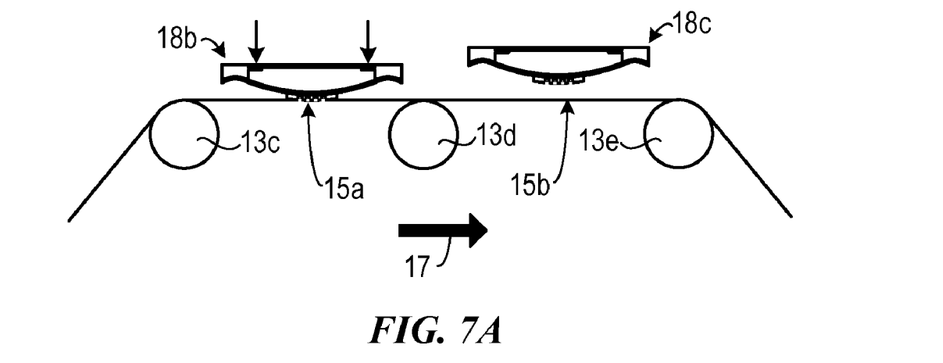
FIG. 7A illustrates a simplified side view of a lithography system having an applied force providing contact between a first imprint lithography template and material on a film sheet.
Figure 7B:
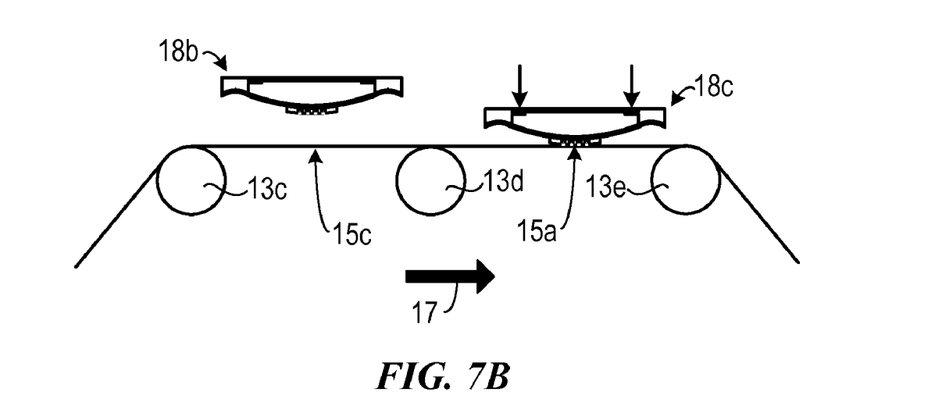
FIG. 7B illustrates a simplified side view of the lithographic system of FIG. 7B having an applied force providing contact between a second imprint lithography template and material on a film sheet.

Film sheet 12 may be coupled to one or more rollers 13. For example, as illustrated in FIG. 2, film sheet 12 may be coupled to rollers 13a and 13b. As illustrated in FIGS. 7A and 7B, film sheet 12 may be coupled to rollers 13c, 13d and 13e. It should be noted that any number of rollers 13 may be used depending on design considerations. For example, in FIGS. 7A and 7B, roller 13d may provide additional support minimizing general and/or localized deformation of film sheet 12. Additional rollers 13 may provide further support to minimize such deformation.

Rollers 13 may facilitate movement of at least a portion of film sheet 12. For example, rollers 13a and 13b of FIG. 2 may rotate to facilitate movement of film sheet 12 in the direction of arrow 17. Such movement may selectively provide different portions of film sheet 12 in superimposition with template 18. For example, first portion 15 of film sheet 12 may have a fixed area in superimposition with template 18. Rollers 13 may selectively facilitate movement of film sheet 12 such that first portion 15 of film sheet may have a fixed 1 meter by 1 meter area in superimposition with template 18 for patterning. After patterning of the fixed area, rollers 13 may facilitate movement of film sheet 12 to offset first portion 15 of film sheet 12 from template 18. For simplicity in description, rollers 13 are not described in detail (e.g., diameter, materiality) as rollers for use within lithography processes are well known within the art.

Each roller 13 may have an axis $A_x$. For example, rollers 13a and 13b in FIG. 2 have an axis $A_1$ and $A_2$ respectively. Axis $A_x$ of rollers 13 may be positioned substantially parallel relative to one another within system 10. For example, rollers 13a and 13b may be positioned substantially parallel and within the same plane $P_1$ relative to one another such that first portion 15 of film sheet 12 may be substantially parallel with respect to template 18 in plane $P_2$. Alternatively, axis $A_x$ of rollers 13 may be positioned substantially parallel and in a different plane relative to one another such that first portion 15 of film sheet 12 may be positioned at an angle with respect to template 18 in plane $P_2$. The degree of the angle may be determined based on design considerations.

Film sheet 12 may be coupled to chuck 16. Chuck 28 may be configured as, but not limited to, vacuum, pin-type, groove-type, electrostatic, electromagnetic, and/or other similar chuck types. Exemplary chucks are further described in U.S. Pat. No. 6,873,087, which is hereby incorporated by reference herein. In one embodiment, chuck 16 may be a porous chuck as further described in U.S. Patent Publication No. 20070190200, which is hereby incorporated by reference herein. In another embodiment, film sheet 12 may be supported by a hollow or solid block in lieu of or in addition to chuck 16. Block may be similar in size and/or shape to chuck 16 and generally may provide support to film sheet to prevent general and/or localized bowing of film sheet 12.

Template 18 may include mesa 20 extending therefrom towards film sheet 12, mesa 20 having a patterning surface 22 thereon. Mesa 20 may be referred to as mold 20 or imprint mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. Thickness of template 18 may be based on design considerations. In one embodiment, template 18 may have a thickness of approximately 0.5 mm.

As illustrated in FIGS. 2-4, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on film sheet 12. Alternatively, patterning surface 22 may be substantially smooth and/or planar.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087, which is hereby incorporated by reference herein. Further, chuck 28 may be coupled to imprint head 30 such that chuck 28 and/or imprint head 30 may be configured to facilitate movement of template 18.

System 10 may further comprise fluid dispense system 32. Fluid dispense system 32 may be used to deposit polymerizable material 34 on film sheet 12. Polymerizable material 34 may be positioned upon film sheet 12 using techniques such as drop dispense, spin-coating, dip coating, chemical vapor deposition (CVD), physical vapor deposition (PVD), thin film deposition, thick film deposition, and/or the like. For example, polymerizable material 34 may be positioned upon film sheet 12 using techniques such as those described in U.S. Patent Publication No. 2005/0270312 and U.S. Patent Publication No. 2005/0106321, both of which are hereby incorporated by reference herein. Polymerizable material 34 may be disposed upon film sheet 12 before and/or after a desired volume is defined between mold 20 and film sheet 12 depending on design considerations.

Polymerizable material 34 may be deposited upon first portion 15 of film sheet 12 as a plurality of spaced apart droplets. For example, polymerizable material 34 may be deposited droplets with each droplet having a unit volume between approximately 1-200 picoliters. Droplets of polymerizable material 34 may be disposed on first portion of film sheet 12 according to a drop pattern. Drop pattern may be based on design considerations and/or determined to provide specific characteristics such as those described in U.S. Patent Publication No. 2005/0270312, which is hereby incorporated by reference herein.

Polymerizable material 34 may comprise a monomer mixture as described in U.S. Pat. No. 7,157,036 and U.S. Patent Publication No. 2005/0187339, both of which are hereby incorporated by reference herein. Additionally, to facilitate wetting and/or adhesion after imprinting, film sheet 12 may be treated with a composition described in U.S. Patent Publication No. 2007/0114686, which is hereby incorporated by reference herein.

Referring to FIGS. 2-4, system 10 may further comprise an energy source 38 coupled to direct energy 40 along path 42. Imprint head 30 and/or rollers 13 may be configured to position template 18 and first portion 15 of film sheet 12 in superimposition with path 42. System 10 may be regulated by processor 54 in communication with rollers 13, imprint head 30, fluid dispense system 32, pump system 60 and/or source 38, and may operate on a computer readable program stored in memory 56.

Imprint head 30 may vary a distance between mold 20 and first portion 15 of film sheet 12 to define a desired volume therebetween that is filled by polymerizable material 34. For example, imprint head 30 may apply a force to template 18 such that mold 20 contacts polymerizable material 34. After the desired volume is filled with polymerizable material 34, source 38 produces energy 40, e.g., ultraviolet radiation, causing polymerizable material 34 to solidify and/or cross-link conforming to a shape of surface 44 of first portion 15 of film sheet 12 and patterning surface 22, defining patterned layer 46 on first portion 15 of film sheet 12. Patterned layer 46 may comprise a residual layer 48 and a plurality of features shown as protrusions 50 and recessions 52, with protrusions 50 having a thickness $t_1$ and residual layer having a thickness $t_2$.

Referring to FIGS. 7A and 7B, multiple templates 18 may be used to form patterned layer 46 on film sheet 12. For example, a first template 18b at a first position may pattern a first portion 15 of patterned layer 46 and a second template 18c at a second position may pattern the first portion 15 of patterned layer 46. The first portion 15 of the patterned layer 46 may be patterned by the first template 18b forming a first layer on the film sheet 12 and the second template 18c patterning a second layer directly over the first layer. Alternatively, the first portion of the patterned layer 46 may be patterned by the first template 18b forming multiple patterned areas with the second template 18c patterning adjacent areas.

After patterning first portion 15 of film sheet 12, rollers 13 may facilitate movement of film sheet 12 such that first portion 15 of film sheet 12 is positioned away (e.g., offset) from template 18 and second portion 17 of film sheet 12 may be positioned in superimposition with template 18. For example, as illustrated in FIG. 2, rollers 13a and 13b may facilitate movement of film sheet 12 in the direction of arrow 17 such that first portion 15 of film sheet is positioned away from template 18 and second portion 17a of film sheet 12 may be positioned in superimposition with template 18. Second portion 17a of film sheet 12 may then be patterned and rollers 13 may facilitate movement of film sheet 12 such that another portion of film sheet 12 may be positioned in superimposition with template 18. This process may be repeated as many times as desired.

Rollers 13 may serve as guides to facilitate movement of film sheet as illustrated in FIG. 2 and/or rollers 13 may store un-patterned film sheet 12 and/or patterned film sheet 12. For example, un-patterned film sheet 12 may concentrically wrap around roller 13a to form a first roll and patterned film sheet 12 may concentrically wrap around roller 13b to form a second roll.

Patterned layer 46 may be protected by a protective film as described in U.S. Patent Publication No. 2008/0308971, which is hereby incorporated by reference herein. Such a protective film may provide for re-capturing of film sheet 12 into a roll without damage to patterned layer 46 and/or subsequent fabricated patterns on film sheet 12. For example, material may be deposited on patterned layer 46 and/or subsequent fabricated patterns on film sheet 12, solidified, and recaptured into roller 13b for storage of film sheet 12.

The above-mentioned system and process may be further employed in imprint lithography processes and systems referred to in U.S. Pat. No. 6,932,934, U.S. Patent Publication No. 2004/0124566, U.S. Patent Publication No. 2004/0188381, and U.S. Patent Publication No. 2004/0211754, all of which are hereby incorporated by reference herein.

Coalescence of Droplets of Polymerizable Material

Figure 5:
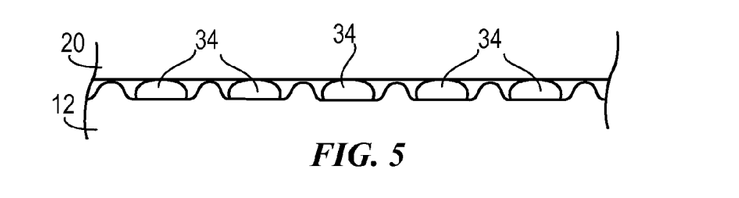
FIG. 5 illustrates a simplified side view of a film sheet having localized trapping of droplets of material on the film sheet.
Figure 6A:
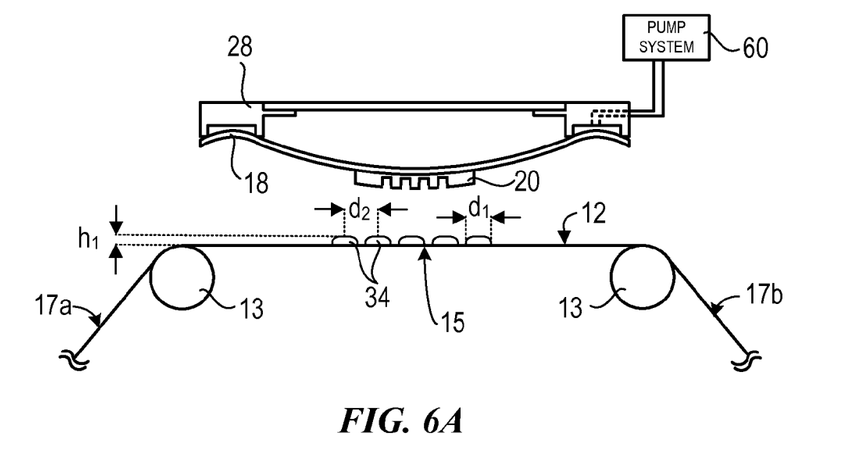
FIG. 6A illustrates a simplified side view of a lithographic system in accordance with an embodiment of the present invention.
Figure 6B:
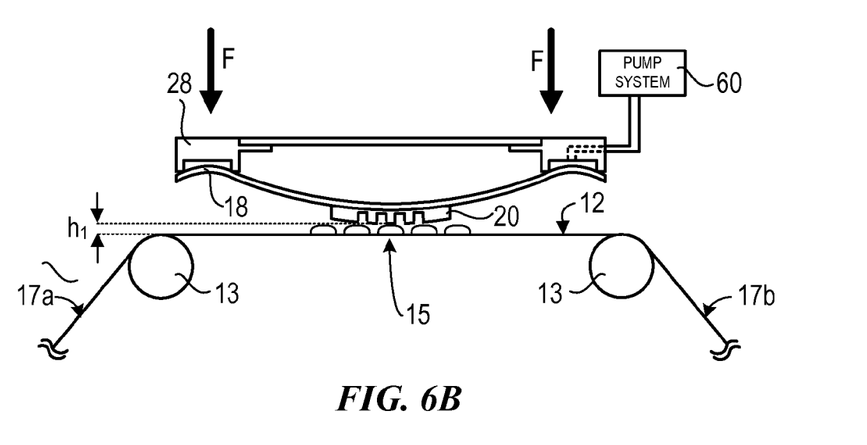
FIG. 6B illustrates a simplified side view of the lithographic system of FIG. 6A having an applied force providing contact between an imprint lithography template and material on a film sheet.

Referring to FIGS. 2 and 5, upon dispensing polymerizable material 34 in droplets positioned on first portion 15 of film sheet 12, droplets of polymerizable material 34 may become trapped between film sheet 12 and/or mold 20. For example, film sheet 12 having minimal thickness (e.g., a thin film sheet of approximately 10 μm-500 μm) may not be able to support the weight of the droplets of polymerizable material 34. As such, film sheet 12 may form undulations under the weight of the droplets trapping the droplets. Such trapping of the droplets of polymerizable material 34 may cause deformation of film sheet 12, as illustrated in FIG. 5. To prevent deformation, film sheet 12 may be kept in a relatively flat configuration (e.g., the surface of film sheet is substantially without projections and/or depressions). Additionally, coalescing droplets to form a continuous layer may minimize and/or prevent droplets of polymerizable material 34 from becoming trapped and deforming film sheet 12.

Referring to FIGS. 2 and 5-7, as previously described, imprint head 30 may apply a force to template 18 such that mold 20 contacts polymerizable material 34. This force and/or other external forces (collectively herein referred to as applied force F or force F) may be controlled to minimize localized trapping of droplets of polymerizable material 34 on film sheet 12. For example, the magnitude of applied force F may be controlled (e.g., minimized) to employ capillary force of polymerizable material 34 with mold 20 and/or film sheet 12 as further described in U.S. Patent Publication No. 2005/0061773, which is hereby incorporated by reference herein.

Control of the applied force F may be determined by:

$$F \propto h^3 v \mu \qquad (EQ. 1)$$

wherein h is the height of droplets (e.g., 200 nm-1000 nm, preferably greater than 400 nm), v is the velocity at which mold 20 contacts droplets (e.g., 20-100 μm/sec); and μ is the viscosity of polymerizable material 34 in the droplets (e.g., 0.5 cps-200 cps).

Additionally, coalescence of drops of polymerizable material 34 may be provided and/or controlled by varying tension associated with film sheet 12. Increased tensile strength may be provided by reinforcing film sheet 12 with fibers (e.g., metal fibers, glass fibers and/or the like). Fibers may be aligned along the direction of the tensile force provided by rollers 13. In one embodiment, the magnitude of tension associated with film sheet 12 may be approximately 1 to 200 N for a film sheet 12 having a thickness of 100 μm, a width of 1 m, and a tensile strength of 1-200 MPa.

Coalescence of droplets of polymerizable material 34 may also be provided and/or controlled by varying a surface contact angle (e.g., 10-300) of polymerizable material 34 on film sheet 12. Exemplary methods for varying the surface contact angle are further described in U.S. Ser. No. 12/336,821 and U.S. Patent Publication No. 2006/0175736, both of which are hereby incorporated by reference herein.

Additionally, coalescence of droplets of polymerizable material 34 may be provided and/or controlled by adjusting viscosity of polymerizable material 34, size of droplets of polymerizable material 34, and/or placement of droplets of polymerizable material 34 on film sheet 12. For example, viscosity of polymerizable material 34 may be varied between 1 cps-200 cps. Droplets may be sized with a diameter between approximately 10 μm-100 μm, a height between approximately 20 nm-1000 nm, and/or a center to center distance between droplets of approximately 10 μm-250 μm. Each of these elements may be adjusted to aid in coalescence of droplets of polymerizable material 34.

Figure 8:
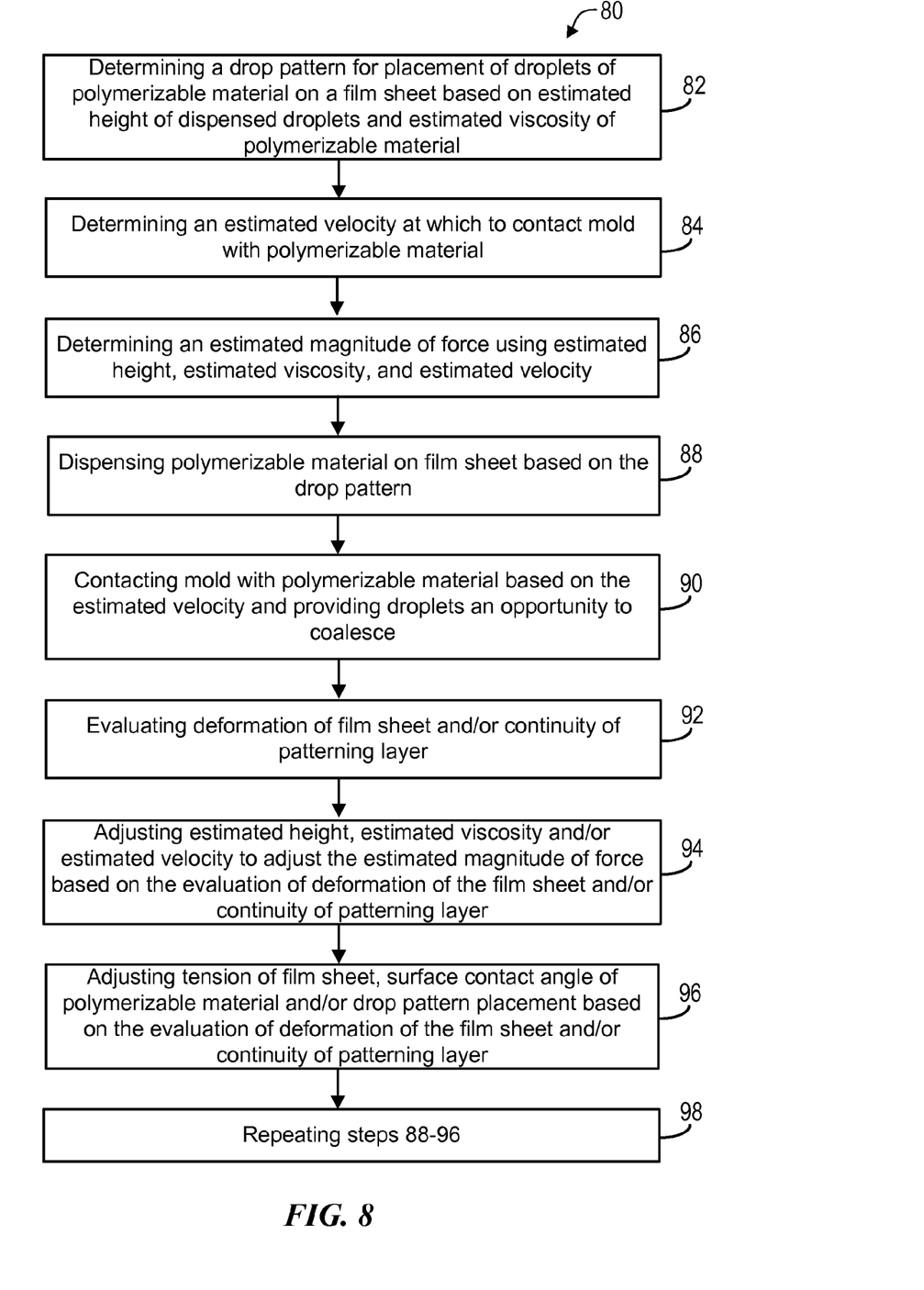
FIG. 8 illustrates a flow chart of a method for imprinting a pattern on a film sheet.

FIG. 8 illustrates a flow chart of an exemplary method 80 for minimizing the trapping of droplets of polymerizable material 34 on film sheet 12 and/or minimizing deformation of film sheet 12 during an imprint lithography process. In a step 82, a drop pattern may be determined for placement of the droplets of polymerizable material 34 on film sheet 12. The drop pattern may be determined to provide a desired residual layer thickness and desired feature formation by mold 20 during the imprint lithography process. Additionally, the drop pattern may be determined using an estimated height of droplets and an estimated viscosity of polymerizable material 34. In a step 84, an estimated velocity at which to contact mold 20 with polymerizable material 34 may be determined. In a step 86, an estimated magnitude of force F may be determined using the estimated height, estimated viscosity, and estimated velocity. In a step 88, polymerizable material 34 may be dispensed on film sheet 12 based on the drop pattern. In a step 90, mold 20 may contact polymerizable material 34 based on the estimated velocity. Droplets may be provided the opportunity to coalesce. Alternatively, conditions (e.g., estimated height, estimated viscosity, and the like)

may be determined such that droplets of polymerizable material 34 coalesce prior to contact of template 18 with the droplets of polymerizable material 34. In a step 92, deformation of film sheet 12 and/or continuity of patterning layer 46 may be evaluated. In a step 94, estimated height of the dispensed droplets and estimated viscosity of polymerizable material 34 may be adjusted, and/or estimated velocity of contact of mold 20 with polymerizable material 34 may be altered to adjust the estimated magnitude of force F based on the evaluation of the deformation of film sheet 12 and/or continuity of patterning layer 46. In a step 96, tension of film sheet 12, surface contact angle of polymerizable material 34 and/or drop placement of droplets in the drop pattern may be adjusted based on the evaluation of the deformation of film sheet 12 and/or continuity of patterning layer 46. In a step 98, steps 86-96 may be repeated until deformation of film sheet 12 is minimized and/or the desired continuity of patterning layer 46 is obtained.

Large Area Patterning

To increase throughput when patterning on film sheet 12, multiple mold 20 and/or multiple template 18 embodiments may be used. For example, referring to FIGS. 2, 9 and 10, template 18 may be provided with a plurality of molds 20 with each mold 20 capable of patterning film sheet 12 at substantially the same time period and/or at relatively different time periods. For example, template 18a of FIG. 9 may include a plurality of molds 20a, 20b, 20c, 20d, 20e, 20f, 20g, 20h and 20i. Molds 20a-20i may be substantially the same as mold 20 illustrated in FIG. 2. Each mold 20a-20i may have substantially the same pattern formed thereon and/or different patterns formed thereon. For example, mold 20b, 20d, 20f and 20h may have substantially the same pattern formed thereon, referred to as $MOLD_1$; and molds 20a, 20c, 20e, 20g and 20i may have substantially the same pattern formed thereon, referred to as $MOLD_2$. Even further $MOLD_2$ may be the compliment of $MOLD_1$. It should be noted that template 18a may have any number of molds 20 positioned thereon, with molds 20 having any combination of patterns depending on design considerations.

Figures 9, 10A:
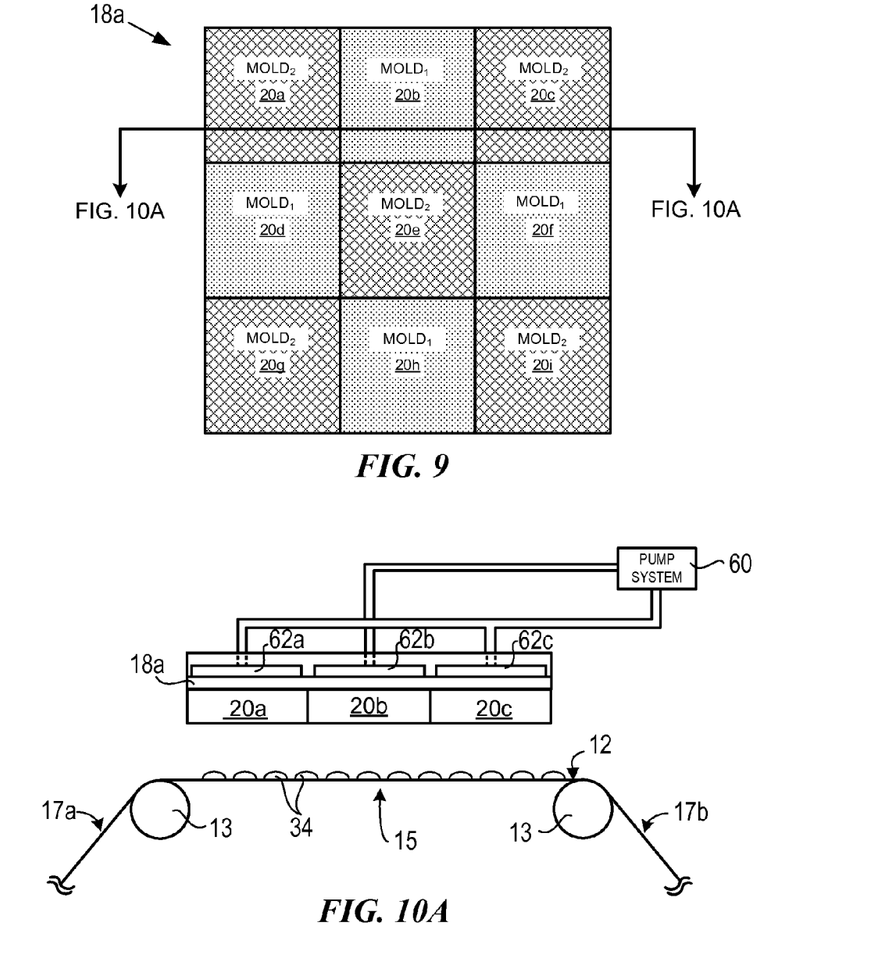
FIG. 9 illustrates a top down view of a template having a plurality of molds.
FIG. 10A illustrates a simplified side view of a lithographic system in accordance with an embodiment of the present invention.
Figure 10B:
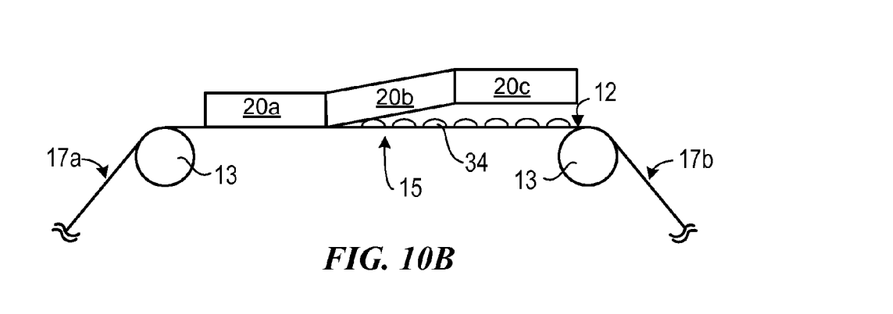
FIG. 10B illustrates a simplified side view of the lithographic system of FIG. 10A having a mold imprinting a pattern on a film sheet in accordance with one embodiment.

Template chuck 28 and/or pump system 60 may control the shape of template 18a shown in FIG. 9. At least a portion of template chuck 28, and an area of template 18a in superimposition with each mold 20 may define a chamber 62. For example, at least a portion of template chuck 28, and an area of template 18a in superimposition with each of molds 20a, 20b and 20c define chambers 62a, 62b and 62c, respectively. For simplicity of illustration, only chambers 62a-62c are shown in FIGS. 10A and 10B; however, it should be understood that chambers 62d-62i may be substantially similar to chambers 62a-62c.

Each chamber 62 may be in fluid communication with pump system 60. Pump system 60 may collectively control pressure within each chamber 62. Alternatively, each chamber 62 may be in communication with a separate pump system 60.

Pump system 60 controls pressure within each chamber 62 to provide patterning of film sheet 12 at substantially the same time period and/or at relatively different time periods. For example, polymerizable material 34 may be dispensed on film sheet 12, and pump system 60 provides for mold 20a to pattern polymerizable material 34 on film sheet 12 at a different time than mold 20b and/or 20c as illustrated in FIG. 10B. Exemplary patterning techniques are further described in U.S. Patent Publication No. 20070190200.

Figure 11:
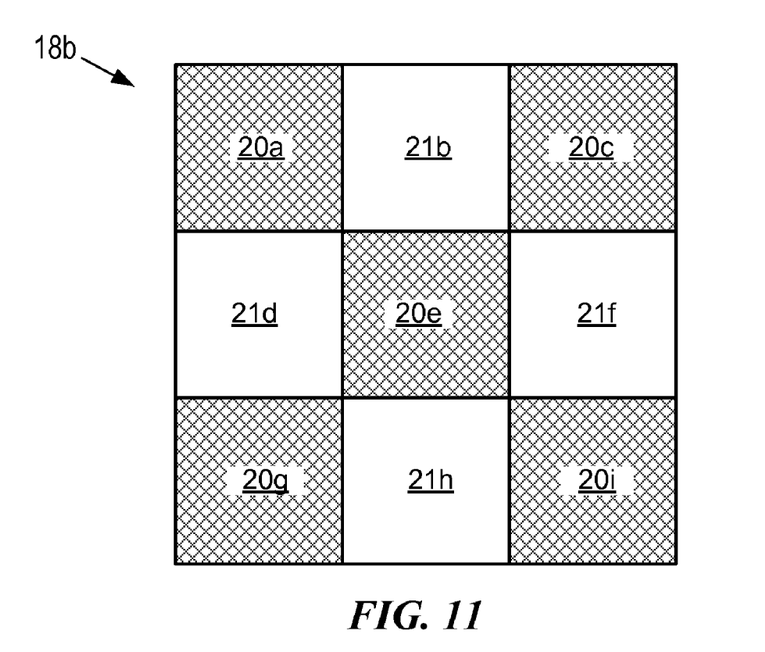
FIG. 11 illustrates a top down view of a first template having a first pattern of molds.
Figure 12:
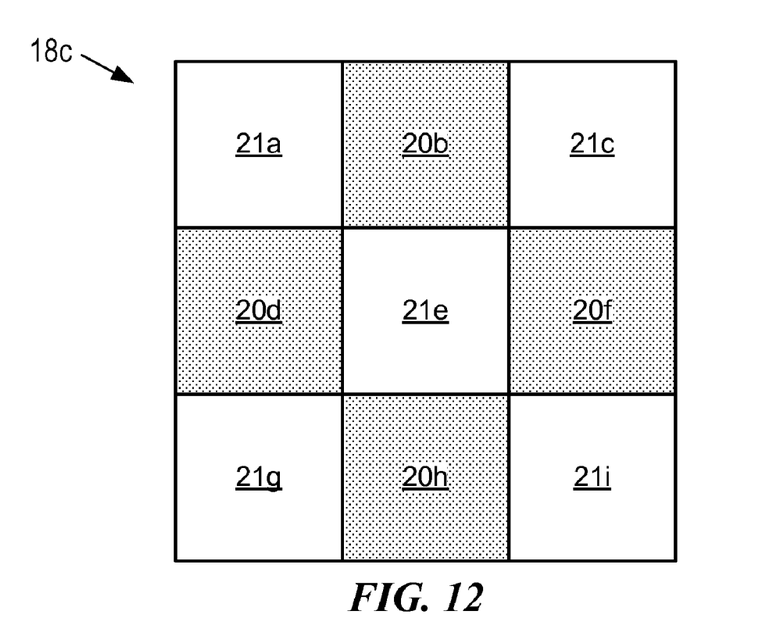
FIG. 12 illustrates a top down view of a second template having a second pattern of molds complimentary to the first pattern of molds of the first template of FIG. 11.

Referring to FIGS. 7, 11 and 12, in another embodiment, system 10 may comprise at least two templates 18b and 18c. Templates 18b and 18c may be substantially similar to templates 18 and 18a as described herein.

Template 18b may be a compliment of template 18c, and vice versa. For example, portions 21 of template 18b that may be substantially absent of mold 20 may have areas in template 18c corresponding to portions 64 having molds 20. As illustrated in FIGS. 7, 11 and 12, template 18b comprises molds 20a, 20c, 20e, 20g and 20i that correspond to portions 21a, 21c, 21e, 21g and 21i of template 18c. Similarly, template 18c comprises molds 20b, 20d, 20f and 20h that correspond to portions 21b, 21d, 21f and 21h of template 18b.

Templates 18b and 18c may be in fluid communication with pump system 60 defining chambers 62a-62i, analogous to the system described above with respect to FIG. 10. For example, with respect to template 18b, at least a portion of template chuck 28 and an area of template 18b in superimposition with each of molds 20a, 20c, 20e, 20g and 20i define chambers 62a, 62c, 62e, 62g and 62i. Further, chambers 62a, 62c, 62e, 62g and 62i may be in superimposition with portions 21a, 21c, 21e, 21g and 21i of template 18c. With respect to template 18c, at least a portion of template chuck 28 and an area of template 18c in superimposition with each of molds 20b, 20d, 20f and 20h define chambers 62b, 62d, 62f and 62h. Further, chambers 62b, 62d, 62f and 62h may be in superimposition with portions 21b, 21d, 21f and 21h of template 18c.

Figure 13:
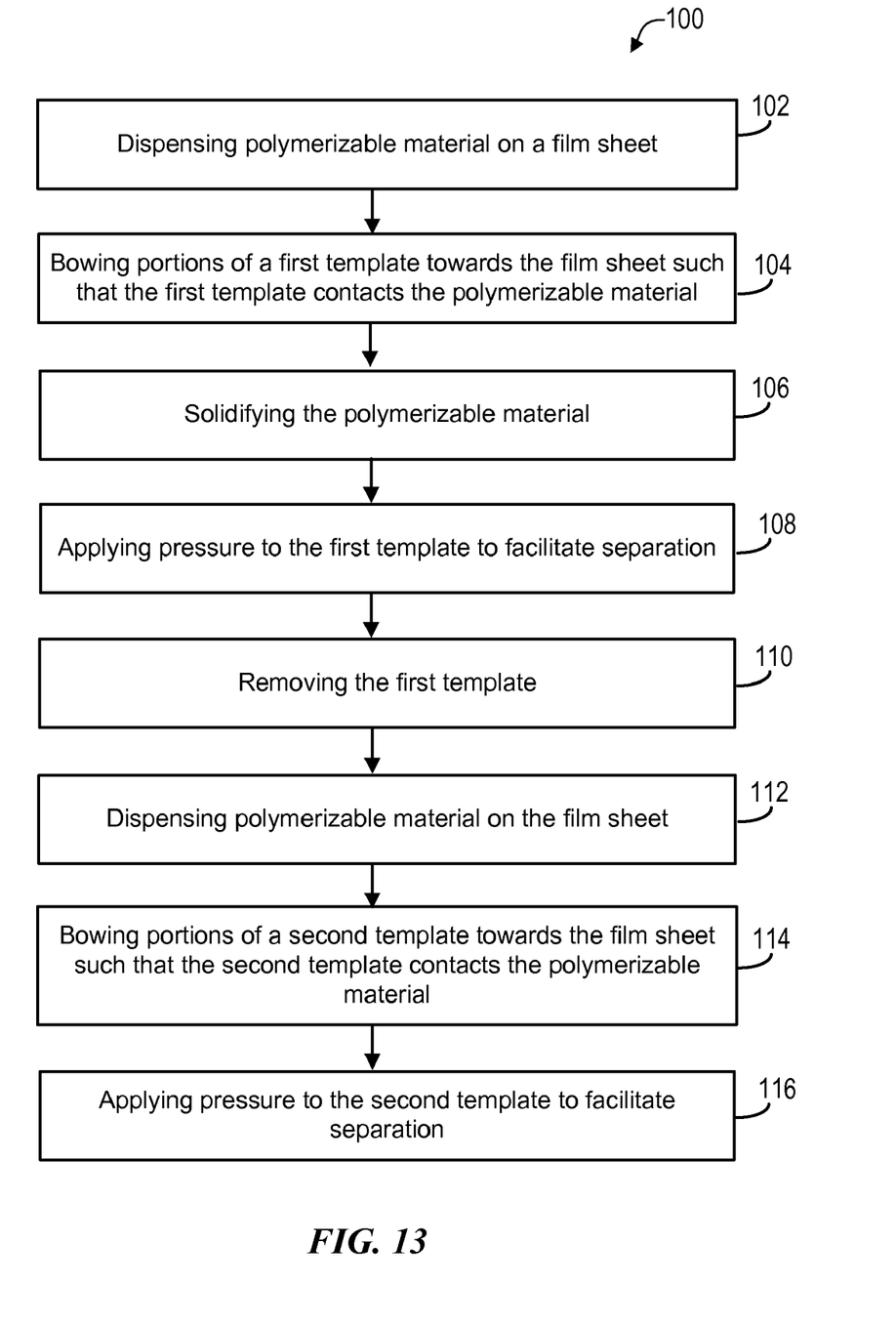
FIG. 13 illustrates a flow chart of a method of imprinting a pattern on a film sheet using multiple templates.

FIG. 13 illustrates a flow chart of a method 100 for using templates 18b and 18c to pattern film sheet 12. In a step 102, polymerizable material 34 may be dispensed on film sheet 12. In a step 104, pump system 60 may place chambers 62b, 62d, 62f and 62h in a vacuum state such that portions 21b, 21d, 21f and 21h of template 18b bow away from film sheet 12 resulting in molds 20a, 20c, 20e, 20g and 20i bowing towards film sheet 12. As such, molds 20a, 20c, 20e, 20g and 20i of template 18b may contact polymerizable material 34 while portions 21b, 21d, 21f and 21h of template 18b are not in contact with polymerizable material 34. In a step 106, polymerizable material may be solidified forming a checkerboard pattern. It should be noted that any pattern may be formed based on design considerations. For example, a first portion of a checkerboard pattern may be formed with the subsequent template providing a second portion of the checkerboard pattern. In an optional step 108, pump system 60 may place chambers 62b, 62d, 62f and 62h in a pressure state to facilitate separation of template 18b with patterned layer 46. In a step 110, template 18b may be removed. In a step 112, polymerizable material 34 may be dispensed on film sheet 12. In a step 114, pump system 60 may place chambers 62a, 62c, 62e, 62g and 62i in a vacuum state such that portions 21a, 21c, 21e, 21g and 21i bow away from film sheet 12 and as a result, molds 20b, 20d, 20f and 20h bow towards film sheet 12. For example, molds 20b, 20d, 20f and 20h may contact polymerizable material 34 while portions 21a, 21c, 21e, 21g and 21i are not in contact with polymerizable material 34. In an optional step 116, pump system 60 may place chambers 62a, 62c, 62e, 62g and 62i in a pressure state to facilitate separation of template 18c with patterned layer 46. It should be noted that template 18c is capable of patterning polymerizable material 34 prior to patterning of polymerizable material 34 by template 18b.

Patterning of film sheet 12 may be employed in any application desired. For example, patterning of film sheet 12 may be used in nanostructuring for solar cells having a feature size of 10 nm-100 nm as further described in U.S. Ser. No. 12/324,120, which is hereby incorporated by reference herein. Additionally, patterning of film sheet 12 may be used in nanopatterning for sub wavelength photonic devices such as polarizers having a size of approximately 50 nm-500 nm;

photonic crystals having a feature size of 50 nm-500 nm; micro lens structures having a size of approximately 1 µm-500 µm, three dimensional structures, etc.

What is claimed is:

1. A method for patterning polymerizable material on a film sheet, comprising:
    dispensing a plurality of droplets of polymerizable material on the film sheet;
    providing a tension to the film sheet prior to dispensing the droplets;
    applying a force to a first imprint lithography template such that the first imprint lithography template contacts the droplets of polymerizable material on the film sheet,
    wherein the applied template force and the provided film sheet tension are pre-determined to minimize localized trapping of the droplets of the polymerizable material on the film sheet such that droplets coalesce to form a continuous layer during contact with the first imprint lithography template; and,
    solidifying the polymerizable material to form a patterned layer having a residual layer and at least one feature;
    wherein the first imprint lithography template includes a plurality of molds that include a first subset of molds complimentary to a second subset of molds.

2. The method of claim 1, further comprising adjusting a surface contact angle of the polymerizable material prior to dispensing the droplets such that the droplets when dispensed on the film sheet coalesce to form the continuous layer.

3. The method of claim 1, further comprising adjusting viscosity of the polymerizable material prior to dispensing the droplets such that the droplets when dispensed on the film sheet coalesce to form the continuous layer.

4. The method of claim 1, further comprising adjusting size of the droplets of the polymerizable material prior to dispensing the droplets such that the droplets when dispensed on the film sheet coalesce to form the continuous layer.

5. The method of claim 1, further comprising adjusting the placement of the polymerizable material prior to dispensing the droplets such that the droplets when dispensed on the film sheet coalesce to form the continuous layer.

6. The method of claim 1, wherein the film sheet is coupled to a first roller and a second roller, the first roller and the second roller positioned substantially parallel relative to one another such that the first portion of the film sheet is substantially parallel to the first imprint lithography template.

7. A method for patterning polymerizable material on a film sheet, comprising:
    dispensing a plurality of droplets of polymerizable material on the film sheet;
    providing a tension to the film sheet prior to dispensing the droplets;
    applying a force to a first imprint lithography template such that the first imprint lithography template contacts the droplets of polymerizable material on the film sheet,
    wherein the first imprint lithography template includes a plurality of molds that are substantially similar,
    wherein the applied template force and the provided film sheet tension are pre-determined to minimize localized trapping of the droplets of the polymerizable material on the film sheet such that droplets coalesce to form a continuous layer during contact with the first imprint lithography template; and,
    solidifying the polymerizable material to form a patterned layer having a residual layer and at least one feature;
    the method further comprising a chucking system adjacent to the first imprint lithography template, wherein the chucking system is in superimposition with each mold to define a plurality of chambers.

8. The method of claim 7, further comprising a pump system in fluid communication with each chamber, the pump system capable of providing each chamber in a vacuum state such that portions of the first imprint lithography template bow away from the film sheet and portions of the template bow towards the film sheet.

9. The method of claim 7, further comprising a pump system in fluid communication with each chamber, the pump system capable of providing each chamber in a pressure state.

10. A method for patterning polymerizable material on a film sheet, comprising:
    dispensing a plurality of droplets of polymerizable material on the film sheet;
    providing a tension to the film sheet prior to dispensing the droplets;
    applying a force to a first imprint lithography template such that the first imprint lithography template contacts the droplets of polymerizable material on the film sheet,
    wherein the applied template force and the provided film sheet tension are pre-determined to minimize localized trapping of the droplets of the polymerizable material on the film sheet such that droplets coalesce to form a continuous layer during contact with the first imprint lithography template;
    solidifying the polymerizable material to form a patterned layer having a residual layer and at least one feature; and
    patterning a second patterned layer on the patterned layer with a second imprint lithography template, wherein the second imprint lithography template is positioned offset from the polymerizable material during formation of the patterned layer with the first imprint lithography template and the first imprint lithography template is positioned offset from the patterned layer during patterning with the second imprint lithography template.

11. The method of claim 10, wherein the first imprint lithography template includes a plurality of molds having patterning features extending towards the film sheet and a plurality of portions substantially absent of molds with patterning features.

12. The method of claim 10, wherein the second imprint lithography template is a compliment of the first imprint lithography template.

13. The method of claim 10, wherein a force applied to the second imprint lithography template to pattern the patterned layer may be determined to minimize undulations in the film sheet such that film sheet is substantially flat.

14. The method of claim 10, wherein the film sheet is coupled to a first roller and a second roller, further comprising:
    recapturing, by the second roller, the film sheet having the patterned layer and the second patterned layer; and,
    patterning a film on the second patterned layer prior to recapturing, the film protecting the second patterned layer from damage during recapturing of the film sheet.

* * * * *